United States Patent
Yamazaki et al.

(10) Patent No.: US 8,378,335 B2
(45) Date of Patent: Feb. 19, 2013

(54) SEMICONDUCTOR DEVICE AND METHOD FOR FABRICATING THE SAME

(75) Inventors: Yuichi Yamazaki, Tokyo (JP); Makoto Wada, Kanagawa (JP); Tadashi Sakai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 13/075,591

(22) Filed: Mar. 30, 2011

(65) Prior Publication Data

US 2012/0068160 A1    Mar. 22, 2012

(30) Foreign Application Priority Data

Sep. 16, 2010   (JP) ................................. 2010-208131

(51) Int. Cl.
*H01L 29/06*    (2006.01)
(52) U.S. Cl. ............. 257/29; 257/E29.068; 257/E21.09; 438/478; 977/734
(58) Field of Classification Search .................... 257/29, 257/E29.08, E21.09; 977/734; 438/478
See application file for complete search history.

(56) References Cited

U.S. PATENT DOCUMENTS

| 2010/0200840 A1* | 8/2010 | Anderson et al. ............... 257/29 |
| 2011/0006425 A1 | 1/2011 | Wada et al. |
| 2011/0108609 A1* | 5/2011 | Woo et al. ..................... 228/176 |

OTHER PUBLICATIONS

Salvador Barraza-Lopez et al., "Effects of Metallic Contacts on Electron Transport through Graphene," The American Physical Society, Physical Review Letters, Feb. 19, 2010, pp. 076807-1 to 076807-4.
Japanese Office Action Issued Aug. 15, 2012 in Patent Application No. 2010-208131 (with English translation).

* cited by examiner

*Primary Examiner* — Kimberly Rizkallah
*Assistant Examiner* — Timor Karimy
(74) *Attorney, Agent, or Firm* — Oblon, Spivak, McClelland, Maier & Neustadt, L.L.P.

(57) ABSTRACT

A semiconductor device according to an embodiment, includes a catalytic metal film, a graphene film, a contact plug, and an adjustment film. The catalytic metal film is formed above a substrate. The graphene film is formed on the catalytic metal film. The contact plug is connected to the graphene film. The adjustment film is formed in a region other than a region connected to the contact plug of a surface of the graphene film to adjust a Dirac point position in a same direction as the region connected to the contact plug with respect to a Fermi level.

9 Claims, 9 Drawing Sheets

SEMICONDUCTOR DEVICE AND METHOD FOR FABRICATING THE SAME

CROSS-REFERENCE TO RELATED APPLICATION

This application is based upon and claims the benefit of priority from Japanese Patent Application No. 2010-208131 filed on Sep. 16, 2010 in Japan, the entire contents of which are incorporated herein by reference.

FIELD

Embodiments described herein relate generally to a semiconductor device and a method for fabricating the same.

BACKGROUND

Graphene is a substantially two-dimension equivalent nano material formed in a sheet shape of carbon atoms. The material exhibits extremely superior properties in high current density resistance, superhigh mobility, high heat resistance, and high mechanical strength. Therefore, like a carbon nanotube, graphene is regarded as a promising wire material of semiconductor devices. For example, it is theoretically predicted that a graphene nanoribbon whose width is processed up to about 10 nm exhibits electric conductivity exceeding that of copper. To actually produce a wire structure by using graphene as a wire material, it is necessary to combine with materials of electrodes, dielectric films and the like. In contrast to conventional wire materials such as aluminum (Al), tungsten (W), and copper (Cu), graphene is a sheet of layer of several atoms and thus, characteristics (carrier density, carrier type, mobility and the like) thereof change significantly depending on a material in contact therewith. For example, the Dirac point drops by about −0.6 eV in a portion where Al as an electrode is in contact with a crosslinking portion up in the air with only a graphene film due to a doping effect of Al. The crosslinking portion is thereby doped with n-type. As a result, the carrier density in the Al contact portion increases, but does not change in the crosslinking portion and thus, an npn junction is formed between −0.6 V to 0 V of the applied voltage. Therefore, there is a problem of the formation of a low conductivity region.

It is normally difficult to produce a crosslinking portion with a wire structure in a semiconductor device. Thus, a structure in which an upper-layer wire and a lower-layer wire are insulated by a dielectric film is generally adopted. However, like Al described above, the Dirac point of graphene is shifted by several +eV by being brought into contact with a dielectric film, for example, a silicon oxide film. Regions other than a region of contact come into contact with a dielectric film in the wire structure and thus, a still wider low conductivity region than when Al is brought into contact as an electrode will be formed. This means that the wire structure is ill-suited and a graphene wire structure that reduces a low conductivity region to a minimum is needed.

DETAILED DESCRIPTION

First Embodiment

A semiconductor device according to an embodiment, includes a catalytic metal film, a graphene film, a contact plug, and an adjustment film. The catalytic metal film is formed above a substrate. The graphene film is formed on the catalytic metal film. The contact plug is connected to the graphene film. The adjustment film is formed in a region other than a region connected to the contact plug of a surface of the graphene film to adjust a Dirac point position in a same direction as the region connected to the contact plug with respect to a Fermi level.

A method for fabricating a semiconductor device according to an embodiment, includes forming a catalytic metal film above a substrate, forming a graphene film on the catalytic metal film, forming a contact plug connected to the graphene film; and forming an adjustment film that adjusts a Dirac point position in a same direction as a region connected to the contact plug with respect to a Fermi level in a region other than the region connected to the contact plug of a surface of the graphene film before the contact plug is formed.

A method for fabricating a semiconductor device according to an embodiment, includes forming a catalytic metal film above a substrate, forming a graphene film on the catalytic metal film, forming, on the graphene film, an adjustment film that makes adjustments to move a Dirac point position on a surface of the graphene film when connected to the graphene film in a same direction as a moving direction of a Dirac point on the surface of the graphene film with respect to a Fermi level when a contact plug is connected to the graphene film, forming a dielectric film on the adjustment film; forming an opening until the surface of the graphene film is exposed from a surface of the dielectric film; and forming the contact plug to connect to the graphene film in the opening.

Figure 1:
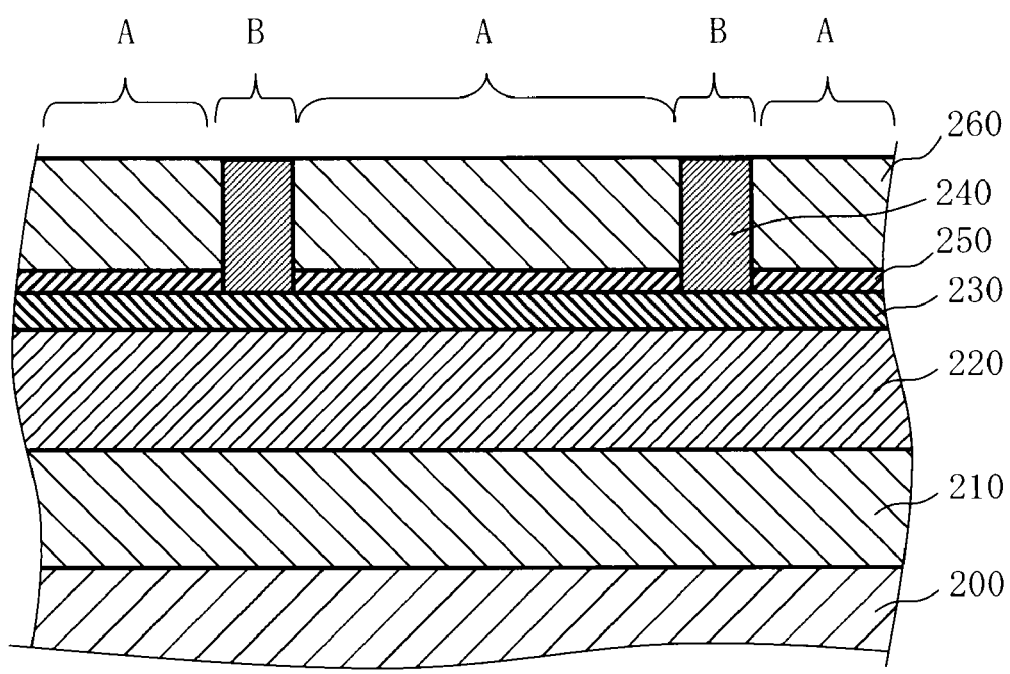
FIG. 1 is a diagram showing a configuration of a semiconductor device according to a first embodiment.

The first embodiment will be described below using the drawings. In FIG. 1, the configuration of a semiconductor device according to the first embodiment is shown. In FIG. 1, a lower-layer wire structure 210 is formed on a substrate 200. Then, a catalytic metal film 220 having catalytic action when graphene is formed is formed on the lower-layer wire structure 210. Then, a graphene film 230 is formed on the catalytic metal film 220. A contact plug 240 connected to an upper-layer wire is connected onto the graphene film 230. On the other hand, an adjustment film 250 (thin film for doping) is formed on a region A other than a region B connected to the contact plug 240 of the surface of the graphene film 230. Then, a dielectric film 260 is formed on the adjustment film 250.

In the first embodiment, while a two-layer wire structure of the catalytic metal film 220 and the graphene film 230 is formed in the region B where the graphene film 230 and the contact plug 240 are connected, a three-layer structure of the catalytic metal film 220, the graphene film 230, and the adjustment film 250 is formed in the region A other than the region B. graphene is, as described above, a sheet of layer of several atoms and thus, characteristics (carrier density, carrier type, mobility and the like) thereof change significantly depending on a material in contact therewith. Therefore, if graphene is brought into direct contact with the dielectric film 260 without forming the adjustment film 250 on the surface side of the graphene in the region A, operation regions with different doping types are generated between the region B where the contact plug 240 is in contact and the region A other than the region B, resulting in a high-resistance wire. In the first embodiment, by contrast, a structure is adopted in which the surface of the graphene film 230 is brought into contact with the adjustment film 250 to avoid direct contact with the dielectric film 260. The adjustment film 250 matches the doping type of the region A of the surface of the graphene film 230 to the doping type of the region B connected to the contact plug 240 and also reduces the difference of doping levels to a minimum. In other words, the adjustment film 250 adjusts the Dirac point position in the same direction as the region B connected to the contact plug 240 with respect to the Fermi level. Further, the adjustment film 250 adjusts the Dirac point position to the same extent as the region B connected to the contact plug 240 with respect to the Fermi level. Accordingly, a low-resistance graphene wire structure can be formed.

Figure 2:
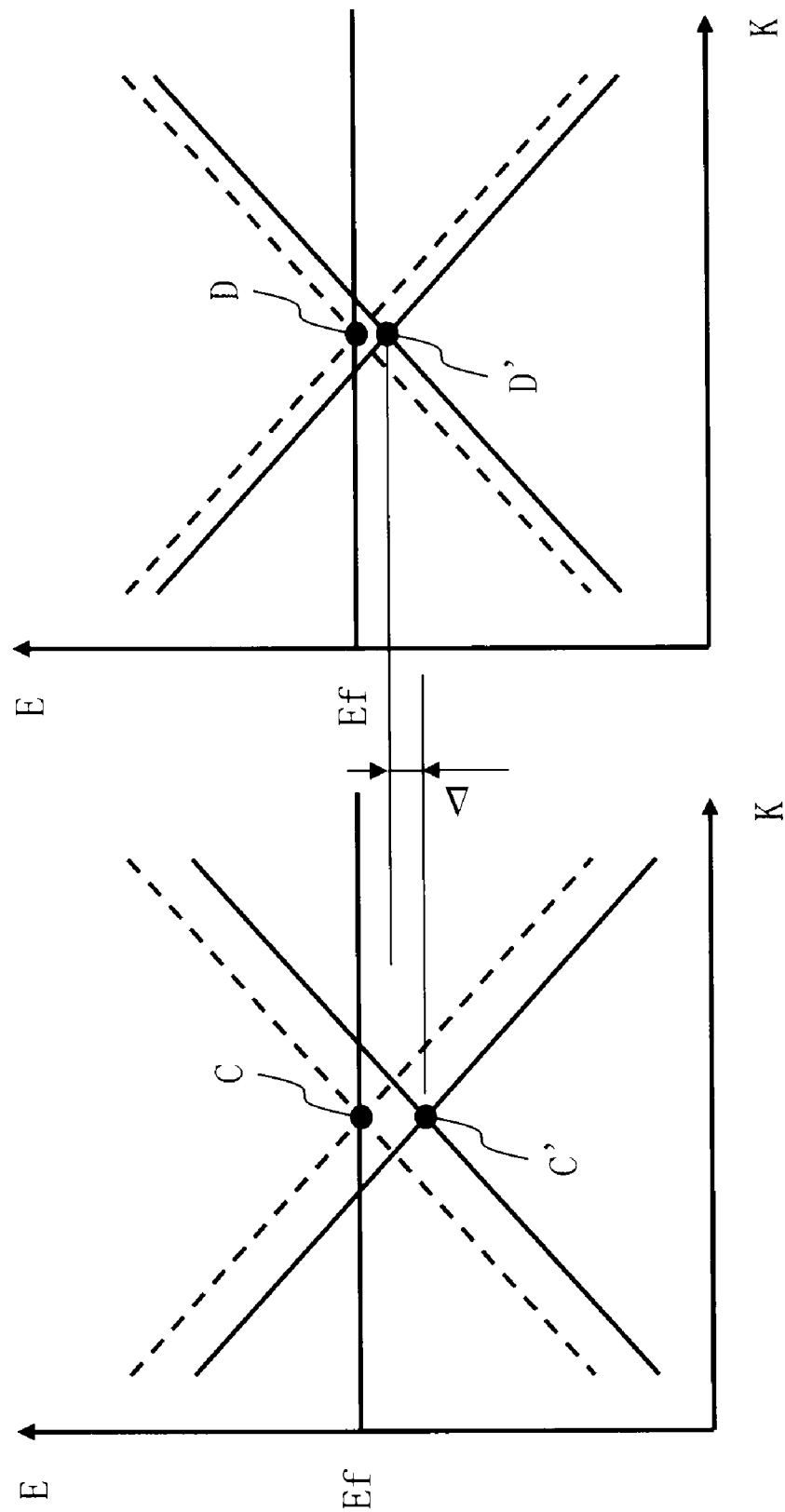
FIGS. 2A and 2B are diagrams exemplifying graphs of energy band according to the first embodiment.

FIG. 2A shows an example of the energy band on the surface of the graphene film 230 in the region B connected to the contact plug 240. FIG. 2B shows an example of the energy band on the surface of the graphene film 230 in the region A connected to the adjustment film 250. In each graph, the vertical axis shows energy E and the horizontal axis shows a wave number K. In both FIGS. 2A and 2B, the energy band in a state in which the graphene film 230 is not in contact with any other film is indicated by dotted lines. In such a state of graphene alone, the position of Dirac points C, D where graphs intersect matches a Fermi level Ef. If the contact plug 240 is connected to the graphene film 230 in such a state, as indicated by solid line graphs in FIG. 2A, the Dirac point position moves from the C position to a C' position with respect to the Fermi level Ef. In the example in FIG. 2A, the Dirac point position moves to the minus side. Thus, in the first embodiment, the Dirac point position is moved, as indicated by solid line graphs in FIG. 2B, from the position D to a position D' by forming the adjustment film 250 in the region A that is not connected to the contact plug A and bringing the adjustment film 250 into contact with the graphene film 230. Thus, the adjustment film 250 adjusts the region A in the same direction as the region B connected to the contact plug 240 with respect to the Fermi level. Here, like the contact plug 240, the Dirac point position is moved to the minus side. Further, the adjustment film 250 adjusts the Dirac point position to the same extent as the region B connected to the contact plug 240 with respect to the Fermi level. Accordingly, the difference in the Dirac point position between the regions A and B is made smaller so that the formation of a high-resistance region can be suppressed. It is suitable to make adjustments so that a difference Δ between the Dirac point position C' in the region B connected to the contact plug 240 of the surface of the graphene film 230 and the Dirac point position D' in the remaining region A connected to the adjustment film 250 becomes ±0.5 eV or less.

Gold (Au), palladium (Pd), silver (Ag), tantalum (Ta), or gallium (Ga) may suitably be used as a material of the adjustment film 250. However, the material thereof is not limited to the above examples. Any material capable of matching the doping type with the region B connected to the contact plug 240 and reducing the difference of doping levels may be used as the material of the adjustment film 250 and may be a metal, organic compound, or inorganic compound.

Further, by forming the adjustment film 250, the energy band structure in the region A connected to the adjustment film 250 of the surface of the graphene film 230 can be made, as indicated by solid line graphs in FIG. 2B, symmetric with respect to a virtual straight line (alternate short and long dash line) in the energy axis direction containing the Dirac point D'. Similarly, as indicated by solid line graphs in FIG. 2B, the energy band structure in the region A can be made symmetric with respect to a virtual straight line (not shown) in the wave number K axis direction containing the Dirac point D'. By maintaining such an energy band structure, characteristics such as superhigh mobility and low resistivity originally held by graphene can be maintained.

Figure 3:
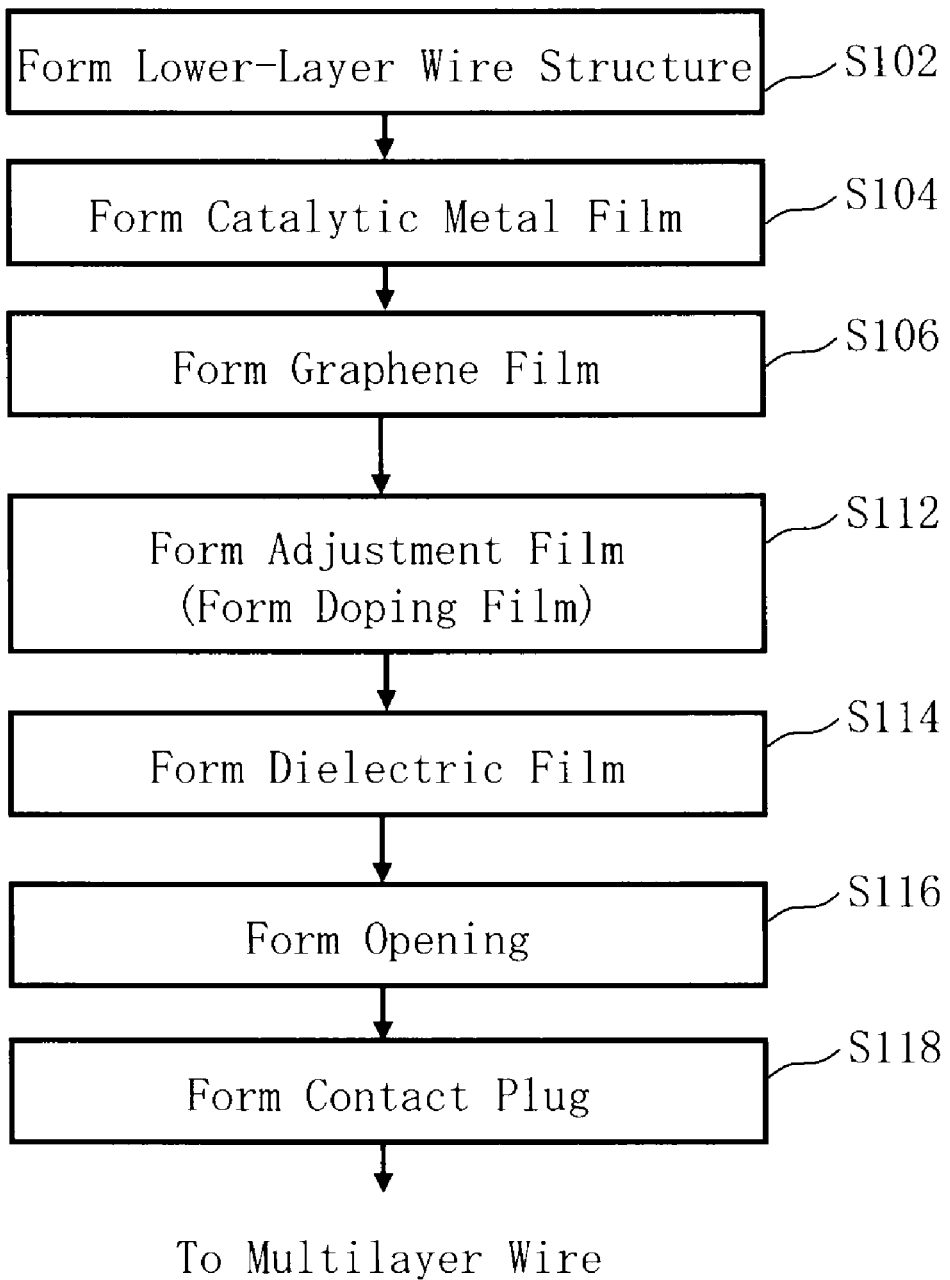
FIG. 3 is a flowchart showing principal part processes of a method for fabricating a semiconductor device according to the first embodiment.

In FIG. 3, a flowchart is showed principal part processes of a method for fabricating a semiconductor device according to the first embodiment. The method for fabricating a semiconductor device according to the first embodiment executes a series of processes including a lower-layer wire structure formation process (S102), a catalytic metal film formation process (S104), a graphene film formation process (S106), an adjustment film formation process (S112), a dielectric film formation process (S114), an opening formation process (S116), and a contact plug formation process (S118).

In FIGS. 4A to 4D, the lower-layer wire structure formation process (S102) to the adjustment film formation process (S112) in FIG. 3, is showed.

Figure 4A:
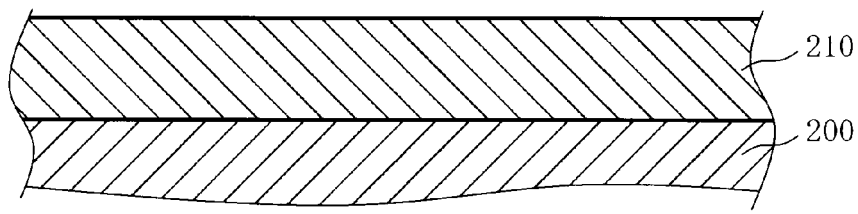
FIGS. 4A to 4D are process sectional views showing the method for fabricating a semiconductor device according to the first embodiment.

In FIG. 4A, as the lower-layer wire structure formation process (S102), the lower-layer wire structure 210 is formed on the substrate 200. As the substrate 200, for example, a 300 mm silicon wafer is suitably used. Various device portions (not shown) are formed in the substrate 200. In addition, other wires may also be formed.

Figure 4B:
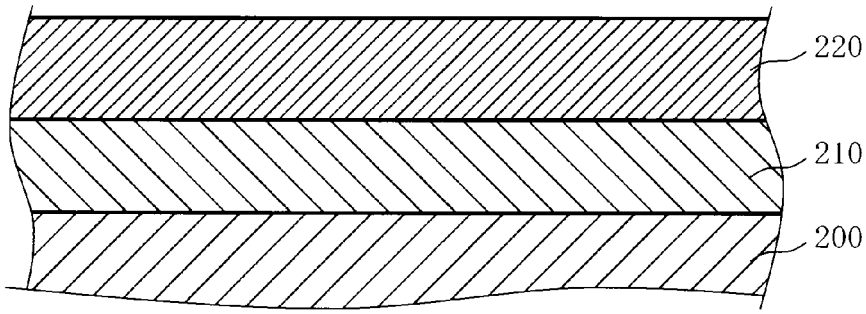

In FIG. 4B, as the catalytic metal film formation process (S104), the catalytic metal film 220 is formed on the lower-layer wire structure 210. The catalytic metal film 220 having a thickness of 100 nm or less, for example, is preferably formed. Then, the catalytic metal film 220 is processed to a wire width by using lithography technology. The catalytic metal film 220 is processed to a wire width of 10 nm, for example. The catalytic metal film 220 is formed of a material suitable for graphene growth and having the catalytic action. At least one of cobalt (Co), nickel (Ni), iron (Fe), copper (Cu), ruthenium (Ru), and platinum (Pt) or an alloy containing at least one of the above metals is suitably used as a material of the catalytic metal film 220. Particularly, Co or Ni is desirable.

Figure 4C:
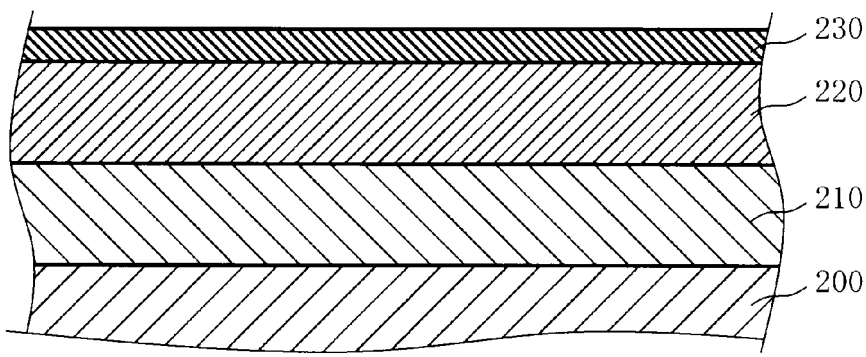

In FIG. 4C, as the graphene film formation process (S106), the graphene film 230 is formed on the catalytic metal film 220. If the catalytic metal film having the wire width of 10 nm is formed in the previous process, the graphene film 230 is formed only in such a portion. The graphene film 230 may be formed by the CVD method. The graphene film 230 is formed by supplying carbon atoms obtained by cracking a carbon-based gas such as methane and acetylene thermally or by using plasma in a temperature region of about 400° C. to 800° C. The graphene film 230 grows on the catalytic metal film 220 using the catalytic metal film 220 as a catalyst. The graphene film 230 is preferably formed to a thickness of 3 nm to 100 nm, for example. However, the thickness is not limited to the above example and the graphene film 230 may be one-layer film whose thickness is less than 3 nm. The graphene film 230 is suitably formed with the number of layers ranging from 1 to 20. The graphene film 230 is more suitably formed by laminating ten layers of film. Regardless of the material of the catalytic metal film 220, characteristics of superhigh mobility originally held by graphene can be demonstrated without being affected by the catalytic metal film 220.

Figure 5:
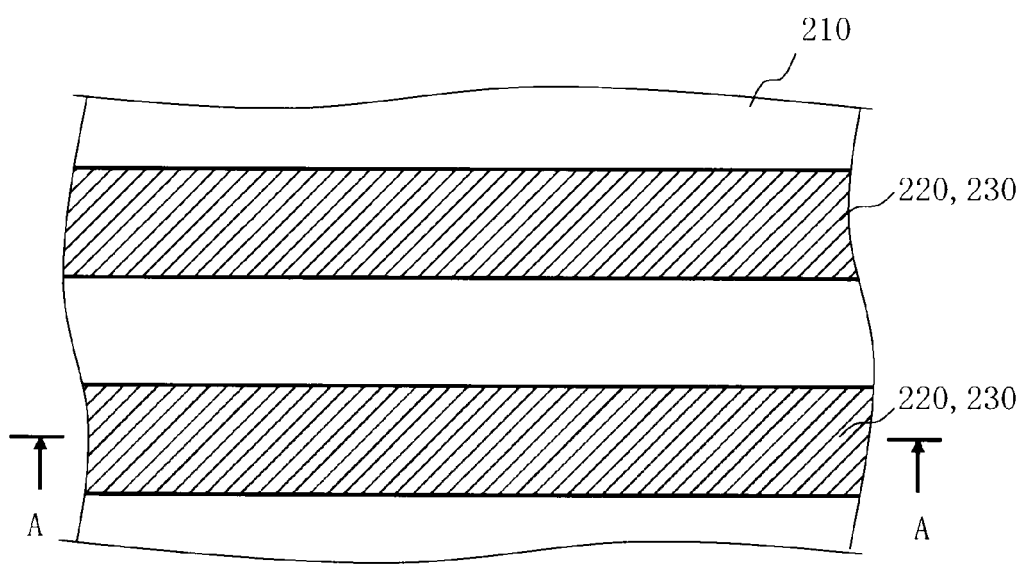
FIG. 5 is a top view showing a wire according to the first embodiment.

In FIG. 5, a top view of a wire according to the first embodiment is showed. In FIG. 5, the wire width is formed by the catalytic metal film 220 and the graphene film 230 on the lower-layer wire structure 210. Here, an example in which a wire is formed in a 1:1 line-and-space pattern is shown. In FIG. 5, only the lower-layer wire structure 210, the catalytic metal film 220, and the graphene film 230 are shown to describe an example of the wiring pattern and the sectional view of a semiconductor device in each above figure and each subsequent figure shows the configuration in the position corresponding to an A-A section in FIG. 5.

Here, to control crystallinity (crystal orientation, crystal quality, surface smoothness and the like) of the graphene film 230, a foundation layer may be inserted immediately below the catalytic metal film 220. Materials of the foundation layer include, for example, titanium (Ti), titanium nitride (TiN), tantalum nitride (TaN), and tantalum (Ta).

Figure 4D:
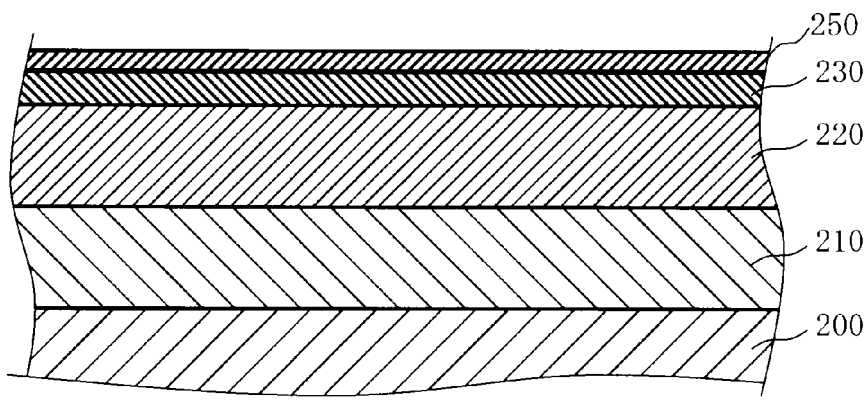

In FIG. 4D, as the adjustment film formation process (S112), the adjustment film 250 is formed on the surface of the graphene film 230 and the exposed lower-layer wire structure 210. The CVD method, evaporation method, plating method, or sputter process may be used as the formation method. Then, lithography technology is used for processing so that the adjustment film 250 remains only on the graphene film 230. The adjustment film 250 is a film to adjust the surface of the graphene film 230 and thus, a film thickness is not needed and a thickness of about 1 to 10 nm is enough. Au, Pd, Ag, Ta, or Ga may suitably be used as a material of the adjustment film 250. Particularly when the material of the contact plug 240 is Ni, Au or Pd is desirable as the material of the adjustment film 250 and when the material of the contact plug 240 is Ti, Ag, Ta, or Ga is desirable as the material of the adjustment film 250.

In the above example, a case when in the three-layer structure of the catalytic metal film 220/the graphene film 230/the adjustment film 250, the wire width is processed so that the three layers are overlapped in each layer, but the present embodiment is not limited to this. For example, after two layers of the catalytic metal film 220/the graphene film 230 are formed over the entire substrate, the two layers may be processed to the wire width and then, after the adjustment film 250 is formed over the entire substrate, the adjustment film 250 may be processed according to the wire width of the graphene film 230 so that the adjustment film 250 remains only on the surface of the graphene film 230. Alternatively, after three layers of the catalytic metal film 220/the graphene film 230/the adjustment film 250 are formed over the entire substrate, the three layers may be processed to the wire width.

Figure 6A:
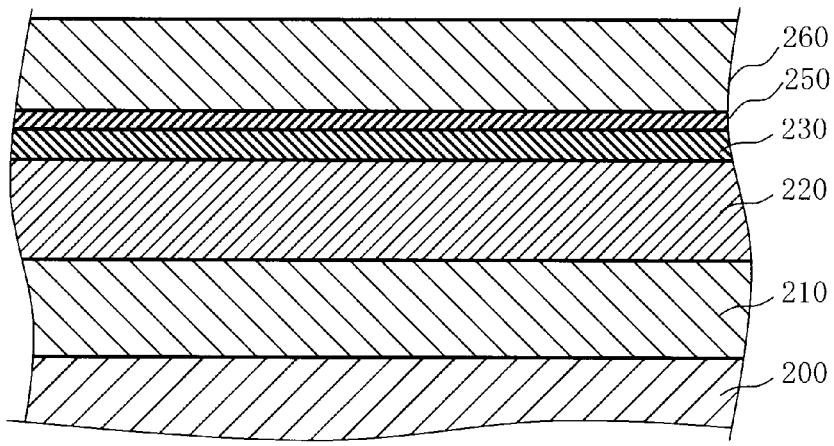
FIGS. 6A to 6C are process sectional views showing the method for fabricating a semiconductor device according to the first embodiment.
Figure 6B:
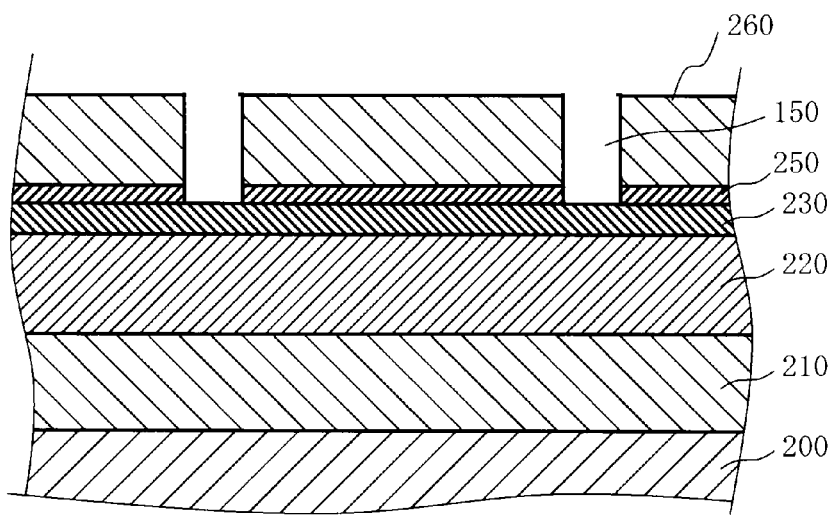
Figure 6C:
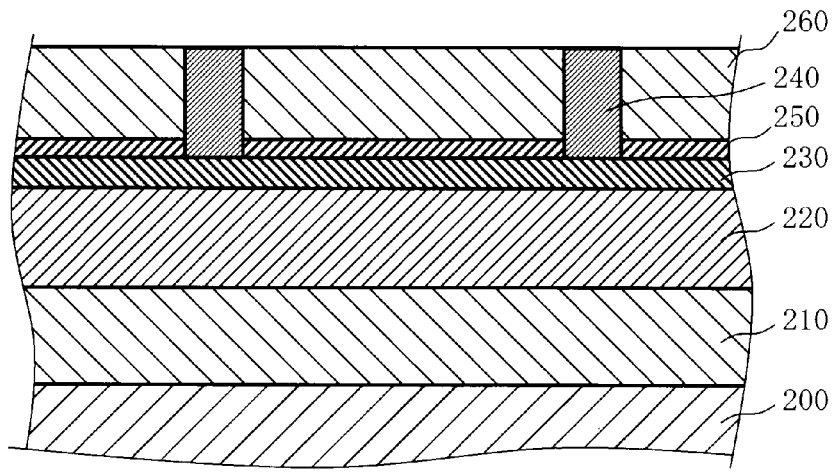

In FIGS. 6A to 6C, the dielectric film formation process (S114) to the contact plug formation process (S118) of FIG. 3, is showed.

In FIG. 6A, as the dielectric film formation process (S114), the dielectric film 260 is formed on the adjustment film 250 and the exposed lower-layer wire structure 210 by the CVD method. Materials of the dielectric film 260 include, for example, $SiO_2$ and SiOC.

In FIG. 6B, as the opening formation process (S116), an opening 150 that will become a via hole to form a contact plug is formed by using lithography technology. Here, the opening is formed in the dielectric film 260 and the adjustment film 250 thereunder to expose the surface of the graphene film 230.

In FIG. 6C, as the contact plug formation process (S118), a contact material is embedded in the opening 150 to form the contact plug 240 in the contact position on the surface of the graphene film 230. A metal is used as a material of the contact plug 240. At least one of, for example, silver (Ag), aluminum (Al), gold (Au), cobalt (Co), chrome (Cr), copper (Cu), iron (Fe), nickel (Ni), tantalum (Ta), titanium (Ti), tungsten (W), and vanadium (V) or an alloy containing at least one of the above metals may suitably be used as a contact metal. The above material of the contact plug is selected to sufficiently bring out characteristics of the graphene film as a wire material and in an extreme case, several nm of the lowest portion of the contact plug made of the above material is enough and other portions may be formed of low-resistance materials, for example, Cu or W.

The excessive material of the contact plug 240 protruding from the dielectric film 260 is polished and removed by the chemical-mechanical polishing (CMP) method to form a semiconductor device having the wire structure shown in FIG. 1.

According to the first embodiment, as described above, the Dirac point position of the region A not in contact with the contact plug 240 is adjusted in the same direction and to the same extent as the region B connected to the contact plug 240 with respect to the Fermi level. Accordingly, the difference in the Dirac point position between the regions A and B is made smaller so that the formation of a high-resistance region can be suppressed. Further, graphene characteristics can be maintained. Therefore, a wire having lower resistance than a conventional Cu wire can be realized.

Figure 7:
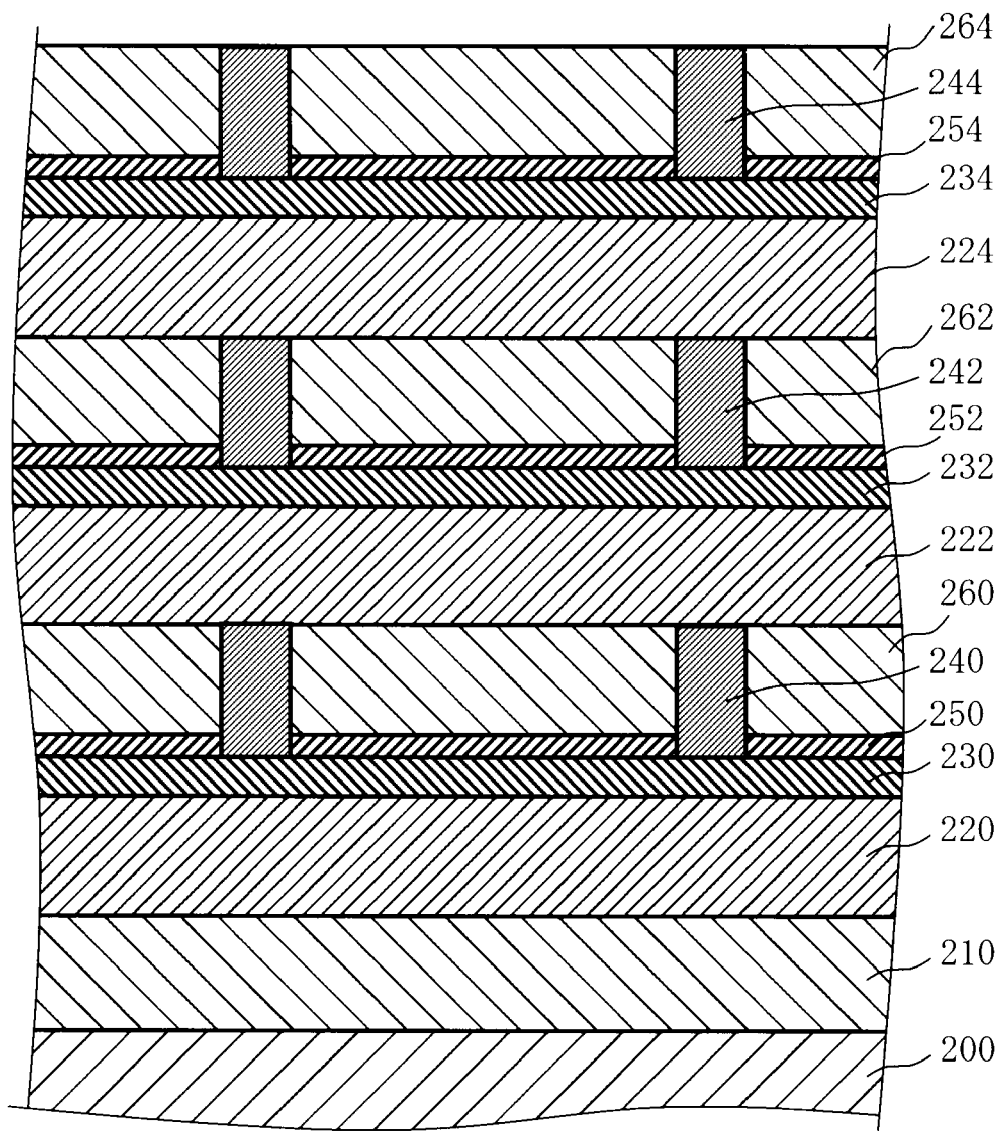
FIG. 7 is a diagram showing a multilayer wire structure of the semiconductor device according to the first embodiment.

FIG. 7 is a diagram showing a multilayer wire structure of the semiconductor device according to the first embodiment. A multilayer wire structure as shown in FIG. 7 can be formed by further repeating the catalytic metal film formation process (S104) to the contact plug formation process (S118) from the state shown in FIG. 1. In the second layer of the multilayer wire structure shown in FIG. 7, a catalytic metal film 222 is formed on the dielectric film 260. Then, a graphene film 232 is formed on the catalytic metal film 222. A contact plug 242 connected to an upper-layer wire is formed on the graphene film 232. On the other hand, an adjustment film 252 (thin film for doping) is formed on a region other than a region connected to the contact plug 242 of the surface of the graphene film 232. Then, a dielectric film 262 is formed on the adjustment film 252. In the third layer of the multilayer wire structure, a catalytic metal film 224 is formed on the dielectric film 262. Then, a graphene film 234 is formed on the catalytic metal film 224. A contact plug 244 connected to an upper-layer wire is connected to the upper surface of the graphene film 234. On the other hand, an adjustment film 254 (thin film for doping) is formed on a region other than a region connected to the contact plug 244 of the surface of the graphene film 234. Then, a dielectric film 264 is formed on the adjustment film 254. FIG. 7 shows a wire structure of three layers of a pair of wire and contact, but still more layers may be formed.

Second Embodiment

In the second embodiment, a case when a barrier metal film is formed between the adjustment film 250 and the dielectric film 260 will be described.

Figure 8:
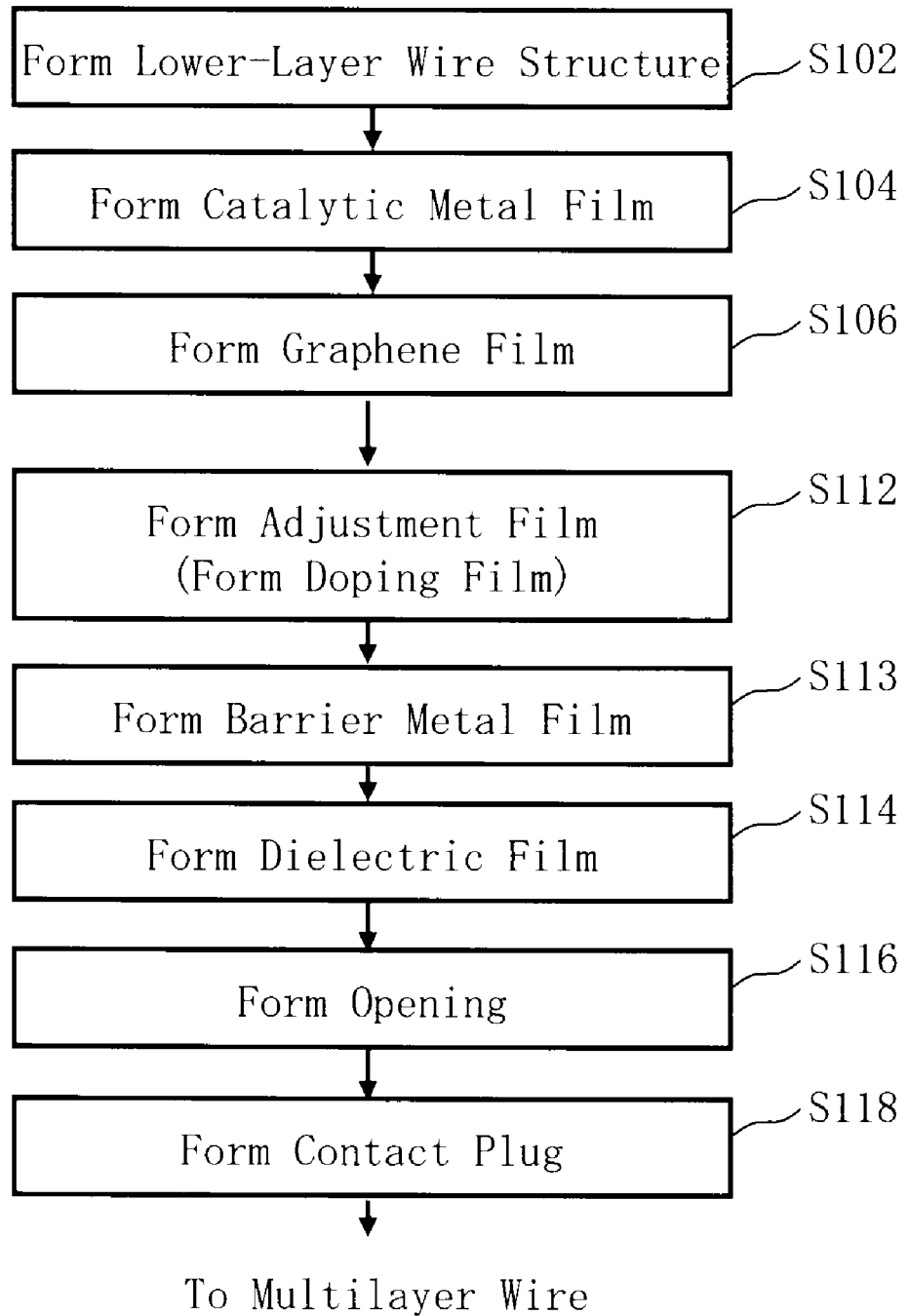
FIG. 8 is a flowchart showing principal part processes of a method for fabricating a semiconductor device according to a second embodiment.

FIG. 8 is a flowchart showing principal part processes of a method for fabricating a semiconductor device according to the second embodiment. The method for fabricating a semiconductor device according to the second embodiment is the same as in FIG. 3 except that a barrier metal film formation process (S113) is added between the adjustment film formation process (S112) and the dielectric film formation process (S114). Content other than content specifically described below is the same as in the first embodiment.

As the barrier metal film formation process (S113), a barrier metal film 270 is formed on the adjustment film 250 from the state shown in FIG. 4D. Here, for example, the barrier metal film 270 is formed on the adjustment film 250 formed over the entire substrate and lithography technology is used to process two layers of the adjustment film 250 and the barrier metal film 270 together to the wire width. Alternatively, the barrier metal film 270 may be formed on the adjustment film 250 processed to the wire width over the entire substrate so that the barrier metal film 270 is subsequently processed to the wire width using lithography technology. Then, in the dielectric film formation process (S114), the dielectric film 260 is formed on the barrier metal film 270 and the exposed lower-layer wire structure 210. Then, the opening formation process (S116) and the contact plug formation process (S118) may be executed. Ti, TiN, Ta, N, or Ru may suitably be used as a material of the barrier metal film 270. The sputter process may be used to form the barrier metal film 270 as the formation method.

Figure 9:
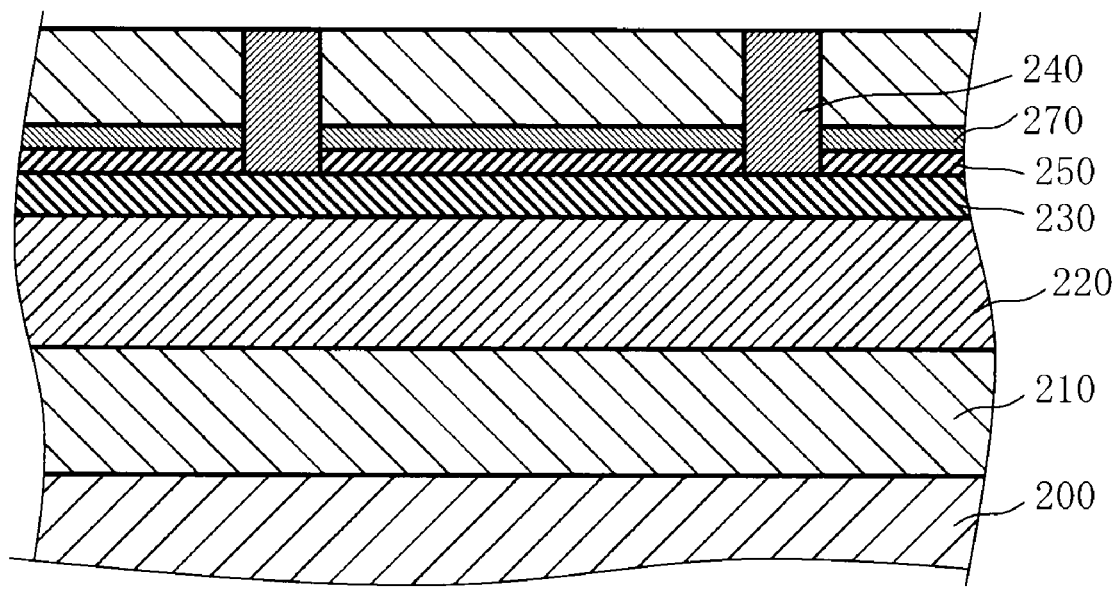
FIG. 9 is a diagram showing the configuration of the semiconductor device according to the second embodiment.

In FIG. 9, a diagram of the configuration of the semiconductor device according to the second embodiment, is showed. In FIG. 9, the barrier metal film 270 is formed between the adjustment film 250 and the dielectric film 260. The other configuration is the same as in FIG. 1. With the barrier metal film 270 formed, the material of the adjustment film 250 can be prevented from being diffused into the dielectric film 260.

In the above embodiment, as described above, a graphene wire structure that reduces a low-conductivity region to a minimum is enabled.

In the foregoing, embodiments have been described with reference to concrete examples. However, the embodiments are not limited to the concrete examples. The above configuration of the semiconductor device can be applied to semiconductor devices of various uses. A high-speed wire can be realized in any use. The above configuration is effective, for example, for memory devices, particularly NAND-type memory devices.

Concerning the thickness of each layer (film) and the size, shape, number and the like of openings, what is needed for semiconductor integrated circuits and various semiconductor elements can be selected and used as appropriate.

In addition, all methods for fabricating a semiconductor device that include elements of the embodiments and whose design can be changed as appropriate by persons skilled in the art are included in the scope of the embodiments.

While techniques normally used in the semiconductor industry such as a photolithography process and cleaning before and after treatment are not described for convenience of description, it is needless to say that such techniques are included in the scope of the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a catalytic metal film formed above a substrate;
   a graphene film formed on the catalytic metal film;
   a contact plug connected to the graphene film; and
   an adjustment film formed in a region other than a region connected to the contact plug of a surface of the graphene film to adjust a Dirac point position of the graphene film in a same direction as the region connected to the contact plug with respect to a Fermi level of the graphene film,
   wherein nickel (Ni) is used as a material of the contact plug and at least one of aluminum (Al) and palladium (Pd) is used as a material of the adjustment film.

2. The device according to claim 1, wherein an energy band structure in the region connected to the adjustment film of the surface of the graphene film is symmetric with respect to an energy axis including a Dirac point and a straight line in a wave number direction.

3. The device according to claim 1, wherein a difference between the Dirac point position in the region connected to the contact plug of the surface of the graphene film and the Dirac point position in the region connected to the adjustment film is ±0.5 eV or less.

4. The device according to claim 1, wherein one of a metal, an organic compound, and an inorganic compound is used as a material of the adjustment film.

5. The device according to claim 1, wherein at least one of silver (Ag), aluminum (Al), gold (Au), cobalt (Co), chrome (Cr), copper (Cu), iron (Fe), nickel (Ni), tantalum (Ta), titanium (Ti), tungsten (W), and vanadium (V) or an alloy containing at least one of the above metals is used as a material of the contact plug.

6. The device according to claim 1, wherein at least one of cobalt (Co), nickel (Ni), iron (Fe), copper (Cu), ruthenium (Ru), and platinum (Pt) or an alloy containing at least one of the above metals is used as a material of the catalytic metal film.

7. The device according to claim 1, wherein the graphene film is formed with a number of layers ranging from 1 to 20 layers.

8. The device according to claim 1, further comprising a dielectric film formed on the adjustment film and on a side surface of the contact plug.

9. The device according to claim 1, wherein the adjustment film is formed thinner than the contact plug.

* * * * *